United States Patent
Zhang et al.

(10) Patent No.: US 11,907,571 B2
(45) Date of Patent: Feb. 20, 2024

(54) READ THRESHOLD OPTIMIZATION SYSTEMS AND METHODS USING DOMAIN TRANSFORMATION

(71) Applicant: SK hynix Inc., Gyeonggi-do (KR)

(72) Inventors: Fan Zhang, Fremont, CA (US); Aman Bhatia, Los Gatos, CA (US); Haobo Wang, San Jose, CA (US)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/927,567

(22) Filed: Jul. 13, 2020

(65) Prior Publication Data

US 2022/0011969 A1    Jan. 13, 2022

(51) Int. Cl.
 G06F 3/06   (2006.01)
 G11C 16/26  (2006.01)
 G11C 11/56  (2006.01)
 G11C 16/04  (2006.01)

(52) U.S. Cl.
 CPC .......... *G06F 3/0659* (2013.01); *G06F 3/0604* (2013.01); *G06F 3/0673* (2013.01); *G11C 16/26* (2013.01); *G11C 11/56* (2013.01); *G11C 16/0483* (2013.01)

(58) Field of Classification Search
 CPC .... G06F 3/0659; G06F 3/0604; G06F 3/0673; G06F 11/1012; G06F 11/1044; G06F 12/0882; G11C 16/26; G11C 11/56; G11C 16/0483; G11C 2029/0411; G11C 29/021; G11C 29/028; G11C 11/5642; G11C 11/1653
 See application file for complete search history.

(56) References Cited

U.S. PATENT DOCUMENTS

| | | | |
|---|---|---|---|
| 8,116,141 B2 | 2/2012 | Yoo et al. | |
| 8,369,141 B2 | 2/2013 | Sommer et al. | |
| 8,605,502 B1 | 12/2013 | Desireddi et al. | |
| 8,885,415 B2 | 11/2014 | Chilappagari et al. | |
| 8,898,553 B1 | 11/2014 | Varnica et al. | |
| 8,913,437 B2 | 12/2014 | Chilappagari et al. | |
| 8,990,665 B1 * | 3/2015 | Steiner | H03M 13/451 714/780 |
| 9,069,659 B1 | 6/2015 | Sabbag et al. | |

(Continued)

OTHER PUBLICATIONS

Cheng Wang et al., DNN-Aided Read-Voltage Threshold Optimization for MLC Flash Memory with Finite Block Length, arXiv:2004.05340v1, Apr. 11, 2020, p. 1-10.

(Continued)

*Primary Examiner* — Rocio Del Mar Perez-Velez
*Assistant Examiner* — Tong B. Vo
(74) *Attorney, Agent, or Firm* — IP & T GROUP LLP

(57) ABSTRACT

A controller optimizes read threshold values for a memory device using domain transformation. The controller determines, for decoded data of each read operation, an asymmetric ratio (AR) and a number of unsatisfied checks (USCs), the AR indicating a ratio of a number of a first binary value to a number of a second binary value in the decoded data. The controller determines a Z-axis such that AR values of threshold sets are arranged in a set order along the Z-axis. The controller determines an optimum read threshold set using coordinate values on the Z-axis, which correspond to a set AR value and a set USC value.

20 Claims, 13 Drawing Sheets

(56) References Cited

U.S. PATENT DOCUMENTS

| | | | |
|---|---|---|---|
| 9,330,775 | B2 | 5/2016 | Kim et al. |
| 9,542,258 | B1 | 1/2017 | Lu et al. |
| 9,589,673 | B1 | 3/2017 | Zhang et al. |
| 9,728,263 | B2 | 8/2017 | Sharon et al. |
| 9,905,289 | B1 | 2/2018 | Jeon et al. |
| 10,216,422 | B2 | 2/2019 | Kim et al. |
| 10,236,067 | B2 | 3/2019 | Fisher et al. |
| 10,276,247 | B2 | 4/2019 | Alhussien et al. |
| 10,290,358 | B2 | 5/2019 | Alhussien et al. |
| 10,573,389 | B2 | 2/2020 | Kim et al. |
| 10,726,934 | B2 | 7/2020 | Chew et al. |
| 10,877,827 | B2 | 12/2020 | Miladinovic |
| 11,501,109 | B2 | 11/2022 | Bazarsky et al. |
| 2010/0091535 | A1 | 4/2010 | Sommer et al. |
| 2010/0149872 | A1* | 6/2010 | Aoyagi ............... G11C 11/5642 365/185.03 |
| 2011/0228583 | A1* | 9/2011 | Noguchi ................ G11C 16/26 365/63 |
| 2012/0236638 | A1* | 9/2012 | Weingarten .......... G11C 16/349 365/185.2 |
| 2013/0176775 | A1* | 7/2013 | Tang ...................... G11C 16/26 365/185.2 |
| 2016/0103763 | A1 | 4/2016 | Chen et al. |
| 2016/0328164 | A1* | 11/2016 | Wang .................... G06F 3/0653 |
| 2017/0076807 | A1* | 3/2017 | Asami ................. G06F 11/1068 |
| 2018/0012663 | A1* | 1/2018 | Alhussien .......... H03M 13/1111 |
| 2019/0004734 | A1 | 1/2019 | Kirshenbaum et al. |
| 2019/0026076 | A1 | 1/2019 | Leng et al. |
| 2019/0115078 | A1 | 4/2019 | Kim et al. |
| 2019/0156180 | A1 | 5/2019 | Nomura et al. |
| 2019/0172542 | A1 | 6/2019 | Miladinovic |
| 2019/0279728 | A1* | 9/2019 | Kodama ............. G11C 11/5642 |
| 2019/0340062 | A1 | 11/2019 | Cai et al. |
| 2019/0347573 | A1 | 11/2019 | Shih |
| 2020/0066353 | A1* | 2/2020 | Pletka ................... G06F 3/0604 |
| 2020/0075118 | A1 | 3/2020 | Chew et al. |
| 2020/0210096 | A1 | 7/2020 | Kim et al. |
| 2020/0210831 | A1 | 7/2020 | Zhang et al. |
| 2020/0234772 | A1 | 7/2020 | Halperin et al. |
| 2020/0265903 | A1 | 8/2020 | Kim et al. |
| 2020/0303016 | A1* | 9/2020 | Amada ................. G06F 3/0659 |
| 2021/0082528 | A1* | 3/2021 | Takizawa ................ G11C 29/38 |
| 2021/0089232 | A1* | 3/2021 | Yamaki ............... G06F 11/1072 |
| 2021/0264983 | A1* | 8/2021 | Lemke ............... G11C 16/3459 |
| 2021/0375364 | A1* | 12/2021 | Liikanen ............... G06F 3/0659 |
| 2022/0068401 | A1 | 3/2022 | Bhatia et al. |
| 2022/0238168 | A1 | 7/2022 | Zhang et al. |
| 2022/0336039 | A1 | 10/2022 | Zhang et al. |
| 2023/0027191 | A1 | 1/2023 | Zhang et al. |
| 2023/0035983 | A1 | 2/2023 | Wang et al. |
| 2023/0036490 | A1 | 2/2023 | Wang et al. |
| 2023/0162803 | A1 | 5/2023 | Zhang et al. |

OTHER PUBLICATIONS

Notice of Allowance issued by the USPTO dated Mar. 8, 2022.
Non-final Office Action issued by United States Patent and Trademark Office for the U.S. Appl. No. 17/443,726 dated Oct. 11, 2022.
Office Action for the U.S. Appl. No. 17/443,755 issued by the USPTO dated Nov. 25, 2022.
Notice of Publication of Application for U.S. Appl. No. 17/532,905 issued by the USPTO dated May 25, 2023.

* cited by examiner

READ THRESHOLD OPTIMIZATION SYSTEMS AND METHODS USING DOMAIN TRANSFORMATION

BACKGROUND

1. Field

Embodiments of the present disclosure relate to a scheme for optimizing read threshold values in a memory system.

2. Description of the Related Art

The computer environment paradigm has shifted to ubiquitous computing systems that can be used anytime and anywhere. As a result, the use of portable electronic devices such as mobile phones, digital cameras, and notebook computers has rapidly increased. These portable electronic devices generally use a memory system having memory device(s), that is, data storage device(s). The data storage device is used as a main memory device or an auxiliary memory device of the portable electronic devices.

Memory systems using memory devices provide excellent stability, durability, high information access speed, and low power consumption, since they have no moving parts. Examples of memory systems having such advantages include universal serial bus (USB) memory devices, memory cards having various interfaces such as a universal flash storage (UFS), and solid state drives (SSDs). Memory systems may use various read thresholds to perform read operations.

SUMMARY

Aspects of the present invention include a memory system and a method for optimizing read threshold values using domain transformation.

In one aspect, a memory system includes a memory device including a plurality of cells and a controller. The controller performs multiple read operations on the plurality of cells using a read threshold set and at least one read retry threshold set, each threshold set including first and second read thresholds. The controller decodes data associated with each of the read operations. The controller determines, for the decoded data of each of the read operations, an asymmetric ratio (AR) and the number of unsatisfied checks (USCs), the AR indicating a ratio of the number of a first binary value to the number of a second binary value in the decoded data. The controller determines a Z-axis such that AR values of the threshold sets are arranged in a set order along the Z-axis. The controller determines an optimum read threshold set using the first and second coordinate values using coordinate values on the Z-axis, which correspond to a set AR value and a set USC value.

In another aspect, a method for operating a memory system includes: performing multiple read operations on the plurality of cells using a read threshold set and at least one read retry threshold set, each threshold set including first and second read thresholds; decoding data associated with each of the read operations; determining, for the decoded data of each of the read operations, an asymmetric ratio (AR) and the number of unsatisfied checks (USCs), the AR indicating a ratio of the number of a first binary value to the number of a second binary value in the decoded data; determining a Z-axis such that AR values of the threshold sets are arranged in a set order along the Z-axis; and determining an optimum read threshold set using coordinate values on the Z-axis, which correspond to a set AR value and a set USC value.

Additional aspects of the present invention will become apparent from the following description.

DETAILED DESCRIPTION

Figure 1:
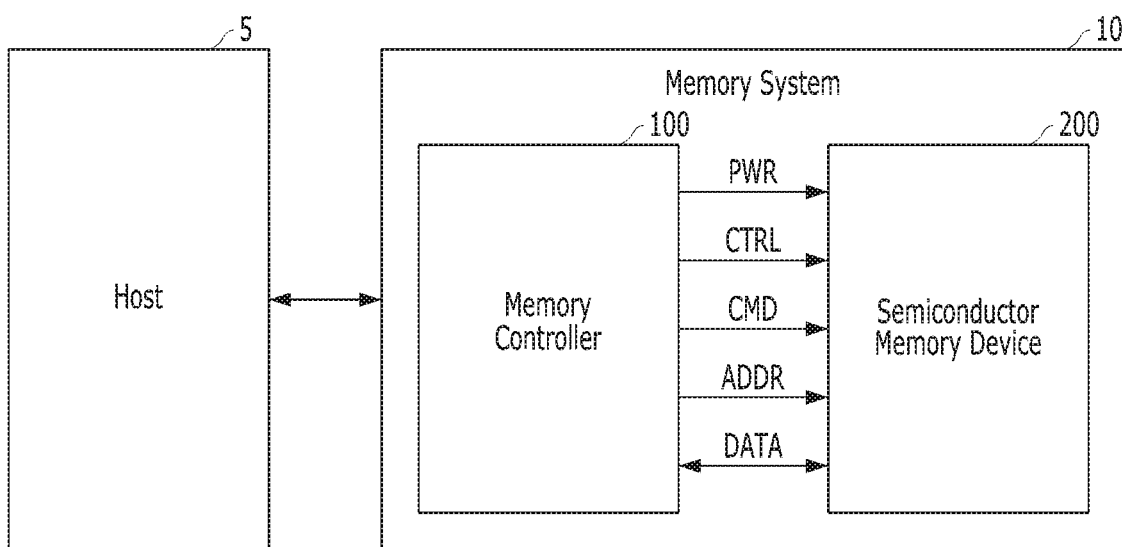
FIG. 1 is a block diagram illustrating a data processing system in accordance with an embodiment of the present invention.

Various embodiments are described below in more detail with reference to the accompanying drawings. The present invention may, however, be embodied in different forms and thus should not be construed as limited to the embodiments set forth herein. Rather, these embodiments are provided so that this disclosure is thorough and complete and fully conveys the scope of the present invention to those skilled in the art. Moreover, reference herein to "an embodiment," "another embodiment," or the like is not necessarily to only one embodiment, and different references to any such phrase are not is necessarily to the same embodiment(s). Throughout the disclosure, like reference numerals refer to like parts in the figures and embodiments of the present invention.

The invention can be implemented in numerous ways, including as a process; an apparatus; a system; a computer program product embodied on a computer-readable storage medium; and/or a processor, such as a processor suitable for executing instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being suitable for performing a task may be implemented as a general component that is temporarily configured to perform the task at a given time or a specific component that is manufactured to perform the task. As used herein, the term 'processor' or the like refers to one or more devices, circuits, and/or processing cores suitable for processing data, such as computer program instructions.

A detailed description of embodiments of the invention is provided below along with accompanying figures that illustrate aspects of the invention. The invention is described in connection with such embodiments, but the invention is not limited to any embodiment. The scope of the invention is limited only by the claims. The invention encompasses numerous alternatives, modifications and equivalents within the scope of the claims. Numerous specific details are set forth in the following description in order to provide a thorough understanding of the invention. These details are provided for the purpose of example; the invention may be practiced according to the claims without some or all of these specific details. For clarity, technical material that is known in technical fields related to the invention has not been described in detail so that the invention is not unnecessarily obscured.

FIG. 1 is a block diagram illustrating a data processing system 2 in accordance with an embodiment of the present invention.

Referring FIG. 1, the data processing system 2 may include a host device 5 and a memory system 10. The memory system 10 may receive a request from the host device 5 and operate in response to the received request. For example, the memory system 10 may store data to be accessed by the host device 5.

The host device 5 may be implemented with any one of various kinds of electronic devices. In various embodiments, the host device 5 may include an electronic device such as a desktop computer, a workstation, a three-dimensional (3D) television, a smart television, a digital audio recorder, a digital audio player, a digital picture recorder, a digital picture player, and/or a digital video recorder and a digital video player. In various embodiments, the host device 5 may include a portable electronic device such as a mobile phone, a smart phone, an e-book, an MP3 player, a portable multimedia player (PMP), and/or a portable game player.

The memory system 10 may be implemented with any one of various kinds of storage devices such as a solid state drive (SSD) and a memory card. In various embodiments, the memory system 10 may be provided as one of various components in an electronic device such as a computer, an ultra-mobile personal computer (PC) (UMPC), a workstation, a net-book computer, a personal digital assistant (PDA), a portable computer, a web tablet PC, a wireless phone, a mobile phone, a smart phone, an e-book reader, a portable multimedia player (PMP), a portable game device, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage device of a data center, a device capable of receiving and transmitting information in a wireless environment, a radio-frequency identification (RFID) device, as well as one of various electronic devices of a home network, one of various electronic devices of a computer network, one of electronic devices of a telematics network, or one of various components of a computing system.

The memory system 10 may include a memory controller 100 and a semiconductor memory device 200. The memory controller 100 may control overall operation of the semiconductor memory device 200.

The semiconductor memory device 200 may perform one or more erase, program, and read operations under the control of the memory controller 100. The semiconductor memory device 200 may receive a command CMD, an address ADDR and data DATA through input/output lines. The semiconductor memory device 200 may receive power PWR through a power line and a control signal CTRL through a control line. The control signal CTRL may include a command latch enable signal, an address latch enable signal, a chip enable signal, a write enable signal, a read enable signal, as well as other operational signals depending on design and configuration of the memory system 10.

The memory controller 100 and the semiconductor memory device 200 may be integrated in a single semiconductor device such as a solid state drive (SSD). The SSD may include a storage device for storing data therein. When the semiconductor memory system 10 is used in an SSD, operation speed of a host device (e.g., host device 5 of FIG. 1) coupled to the memory system 10 may remarkably improve.

The memory controller 100 and the semiconductor memory device 200 may be integrated in a single semiconductor device such as a memory card. For example, the memory controller 100 and the semiconductor memory device 200 may be so integrated to configure a personal computer (PC) card of personal computer memory card international association (PCMCIA), a compact flash (CF) card, a smart media (SM) card, a memory stick, a multimedia card (MMC), a reduced-size multimedia card (RS-MMC), a micro-size version of MMC (MMCmicro), a secure digital (SD) card, a mini secure digital (miniSD) card, a micro secure digital (microSD) card, a secure digital high capacity (SDHC), and/or a universal flash storage (UFS).

Figure 2:
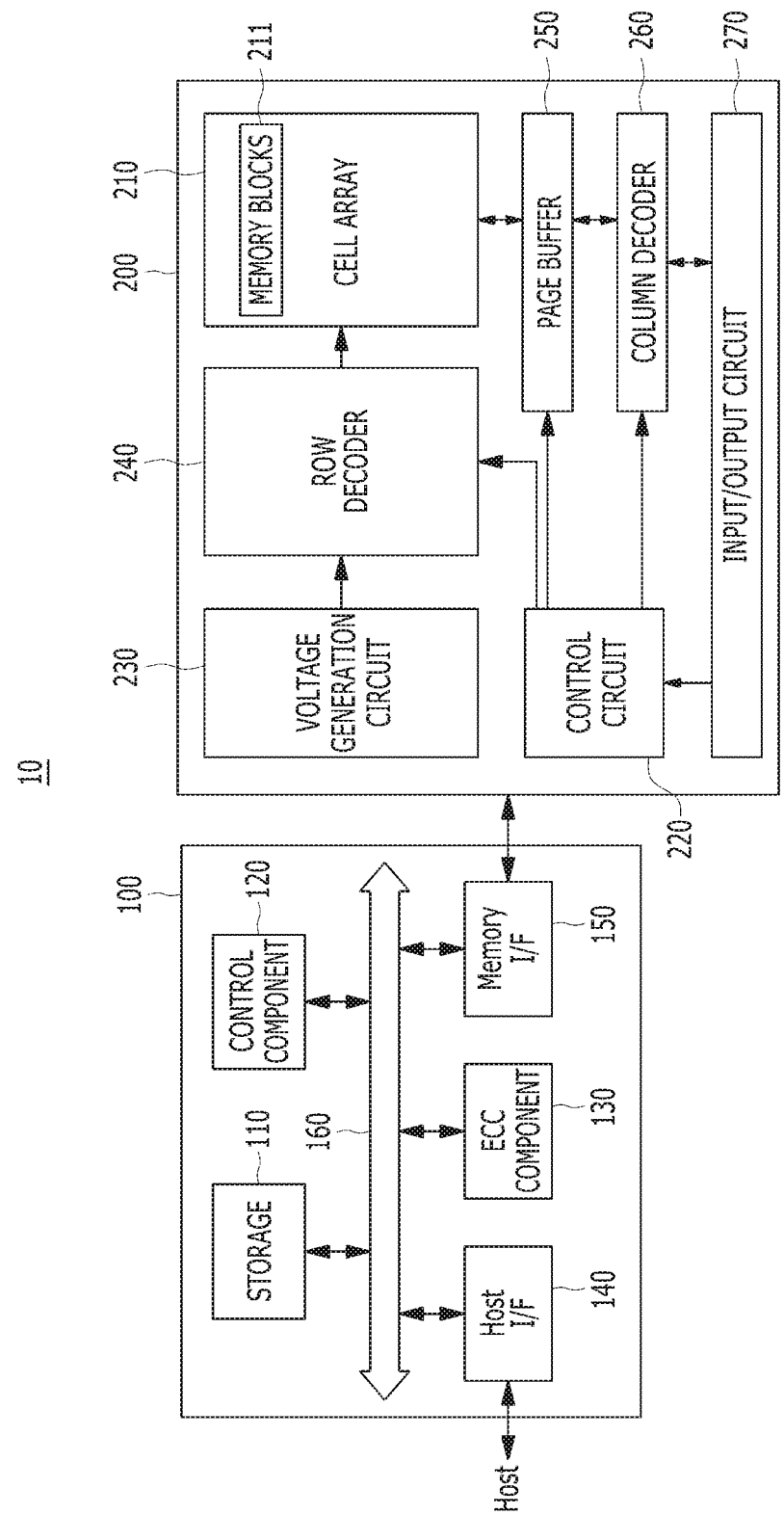
FIG. 2 is a block diagram illustrating a memory system in accordance with an embodiment of the present invention.

FIG. 2 is a block diagram illustrating a memory system in accordance with an embodiment of the present invention. For example, the memory system of FIG. 2 may depict the memory system 10 shown in FIG. 1.

Referring to FIG. 2, the memory system 10 may include a memory controller 100 and a semiconductor memory device 200. The memory system 10 may operate in response to a request from a host device (e.g., host device 5 of FIG. 1), and in particular, store data to be accessed by the host device.

The memory device 200 may store data to be accessed by the host device.

The memory device 200 may be implemented with a volatile memory device such as a dynamic random access memory (DRAM) and/or a static random access memory (SRAM) or a non-volatile memory device such as a read only memory (ROM), a mask ROM (MROM), a programmable ROM (PROM), an erasable programmable ROM (EPROM), an electrically erasable programmable ROM (EEPROM), a ferroelectric random access memory (FRAM), a phase change RAM (PRAM), a magnetoresistive RAM (MRAM), and/or a resistive RAM (RRAM).

The controller 100 may control storage of data in the memory device 200. For example, the controller 100 may control the memory device 200 in response to a request from the host device. The controller 100 may provide data read from the memory device 200 to the host device, and may store data provided from the host device into the memory device 200.

The controller 100 may include a storage 110, a control component 120, which may be implemented as a processor such as a central processing unit (CPU), an error correction code (ECC) component 130, a host interface (I/F) 140 and a memory interface (I/F) 150, which are coupled through a bus 160.

The storage 110 may serve as a working memory of the memory system 10 and the controller 100, and store data for driving the memory system 10 and the controller 100. When the controller 100 controls operations of the memory device 200, the storage 110 may store data used by the controller 100 and the memory device 200 for such operations as read, write, program and erase operations.

The storage 110 may be implemented with a volatile memory such as a static random access memory (SRAM) or a dynamic random access memory (DRAM). As described above, the storage 110 may store data used by the host device in the memory device 200 for the read and write operations. To store the data, the storage 110 may include a program memory, a data memory, a write buffer, a read buffer, a map buffer, and the like.

The control component 120 may control general operation of the memory system 10, and in particular a write operation and a read operation for the memory device 200, in response to a corresponding request from the host device. The control component 120 may drive firmware, which is referred to as a flash translation layer (FTL), to control general operations of the memory system 10. For example, the FTL may perform operations such as logical-to-physical (L2P) mapping, wear leveling, garbage collection, and/or bad block handling. The L2P mapping is known as logical block addressing (LBA).

The ECC component 130 may detect and correct errors in the data read from the memory device 200 during the read operation. The ECC component 130 may not correct error bits when the number of the error bits is greater than or equal to a threshold number of correctable error bits, and instead may output an error correction fail signal indicating failure in correcting the error bits.

In various embodiments, the ECC component 130 may perform an error correction operation based on a coded modulation such as a low density parity check (LDPC) code, a Bose-Chaudhuri-Hocquenghem (BCH) code, a turbo code, a turbo product code (TPC), a Reed-Solomon (RS) code, a convolution code, a recursive systematic code (RSC), a trellis-coded modulation (TCM), or a Block coded modulation (BCM). However, error correction is not limited to these techniques. As such, the ECC component 130 may include any and all circuits, systems or devices for suitable error correction operation.

The host interface 140 may communicate with the host device through one or more of various interface protocols such as a universal serial bus (USB), a multi-media card (MMC), a peripheral component interconnect express (PCI-e or PCIe), a small computer system interface (SCSI), a serial-attached SCSI (SAS), a serial advanced technology attachment (SATA), a parallel advanced technology attachment (PATA), an enhanced small disk interface (ESDI), and/or an integrated drive electronics (IDE).

The memory interface 150 may provide an interface between the controller 100 and the memory device 200 to allow the controller 100 to control the memory device 200 in response to a request from the host device. The memory interface 150 may generate control signals for the memory device 200 and process data under the control of the control component 120. When the memory device 200 is a flash memory such as a NAND flash memory, the memory interface 150 may generate control signals for the memory and process data under the control of the control component 120.

The memory device 200 may include a memory cell array 210, a control circuit 220, a voltage generation circuit 230, a row decoder 240, a page buffer 250, which may be in the form of an array of page buffers, a column decoder 260, and an input and output (input/output) circuit 270. The memory cell array 210 may include a plurality of memory blocks 211 which may store data. The voltage generation circuit 230, the row decoder 240, the page buffer array 250, the column decoder 260 and the input/output circuit 270 may form a peripheral circuit for the memory cell array 210. The peripheral circuit may perform a program, read, or erase operation on the memory cell array 210. The control circuit 220 may control the peripheral circuit.

The voltage generation circuit 230 may generate operation voltages of various levels. For example, in an erase operation, the voltage generation circuit 230 may generate operation voltages of various levels such as an erase voltage and a pass voltage.

The row decoder 240 may be in electrical communication with the voltage generation circuit 230, and the plurality of memory blocks 211. The row decoder 240 may select at least one memory block among the plurality of memory blocks 211 in response to a row address generated by the control circuit 220, and transmit operation voltages supplied from the voltage generation circuit 230 to the selected memory blocks.

Figure 3:
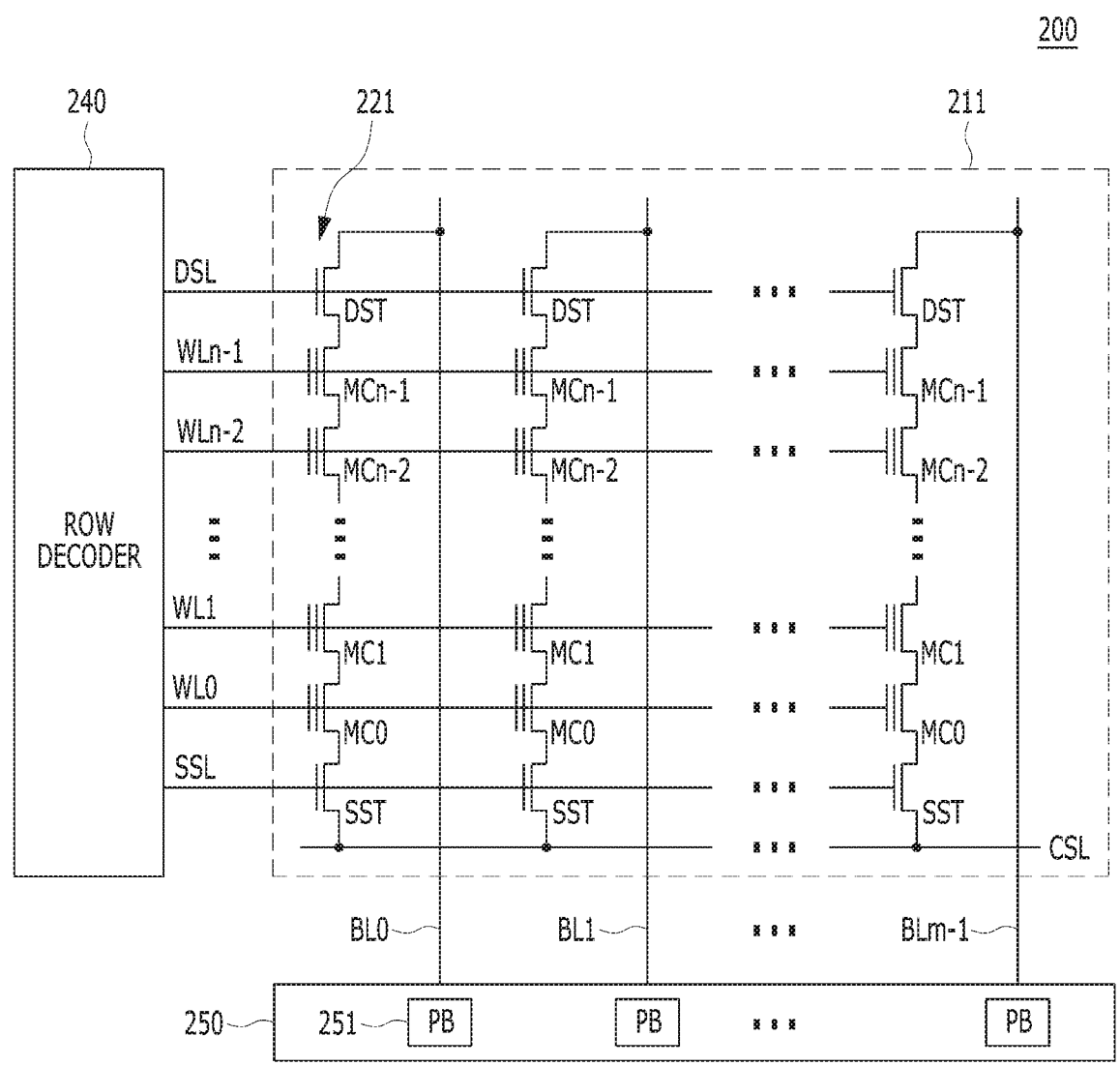
FIG. 3 is a circuit diagram illustrating a memory block of a memory device in accordance with an embodiment of the present invention.

The page buffer 250 may be coupled with the memory cell array 210 through bit lines BL (shown in FIG. 3). The page buffer 250 may precharge the bit lines BL with a positive voltage, transmit data to, and receive data from, a selected memory block in program and read operations, or temporarily store transmitted data, in response to page buffer control signal(s) generated by the control circuit 220.

The column decoder 260 may transmit data to, and receive data from, the page buffer 250 or transmit and receive data to and from the input/output circuit 270.

The input/output circuit 270 may transmit to the control circuit 220 a command and an address, received from an external device (e.g., the memory controller 100 of FIG. 1), transmit data from the external device to the column decoder 260, or output data from the column decoder 260 to the external device, through the input/output circuit 270.

The control circuit 220 may control the peripheral circuit in response to the command and the address.

FIG. 3 is a circuit diagram illustrating a memory block of a semiconductor memory device in accordance with an embodiment of the present invention. For example, the memory block of FIG. 3 may be any of the memory blocks 211 of the memory cell array 210 shown in FIG. 2.

Referring to FIG. 3, the exemplary memory block 211 may include a plurality of word lines WL0 to WLn−1, a drain select line DSL and a source select line SSL coupled to the row decoder 240. These lines may be arranged in parallel, with the plurality of word lines between the DSL and SSL.

The exemplary memory block 211 may further include a plurality of cell strings 221 respectively coupled to bit lines BL0 to BLm−1. The cell string of each column may include one or more drain selection transistors DST and one or more source selection transistors SST. In the illustrated embodiment, each cell string has one DST and one SST. In a cell string, a plurality of memory cells or memory cell transistors MC0 to MCn−1 may be serially coupled between the selection transistors DST and SST. Each of the memory cells may be formed as a single level cell (SLC) storing 1 bit of data, a multi-level cell (MLC) storing 2 bits of data, a triple-level cell (TLC) storing 3 bits of data, or a quadruple-level cell (QLC) storing 4 bits of data.

The source of the SST in each cell string may be coupled to a common source line CSL, and the drain of each DST may be coupled to the corresponding bit line. Gates of the SSTs in the cell strings may be coupled to the SSL, and gates of the DSTs in the cell strings may be coupled to the DSL. Gates of the memory cells across the cell strings is may be coupled to respective word lines. That is, the gates of memory cells MC0 are coupled to corresponding word line WL0, the gates of memory cells MC1 are coupled to corresponding word line WL1, etc. The group of memory cells coupled to a particular word line may be referred to as a physical page. Therefore, the number of physical pages in the memory block 211 may correspond to the number of word lines.

The page buffer array 250 may include a plurality of page buffers 251 that are coupled to the bit lines BL0 to BLm−1. The page buffers 251 may operate in response to page buffer control signals. For example, the page buffers 251 my temporarily store data received through the bit lines BL0 to BLm−1 or sense voltages or currents of the bit lines during a read or verify operation.

In some embodiments, the memory blocks 211 may include NAND-type flash memory cells. However, the memory blocks 211 are not limited to such cell type, but may include NOR-type flash memory cells. Memory cell array 210 may be implemented as a hybrid flash memory in which two or more types of memory cells are combined, or one-NAND flash memory in which a controller is embedded inside a memory chip.

Figure 4:
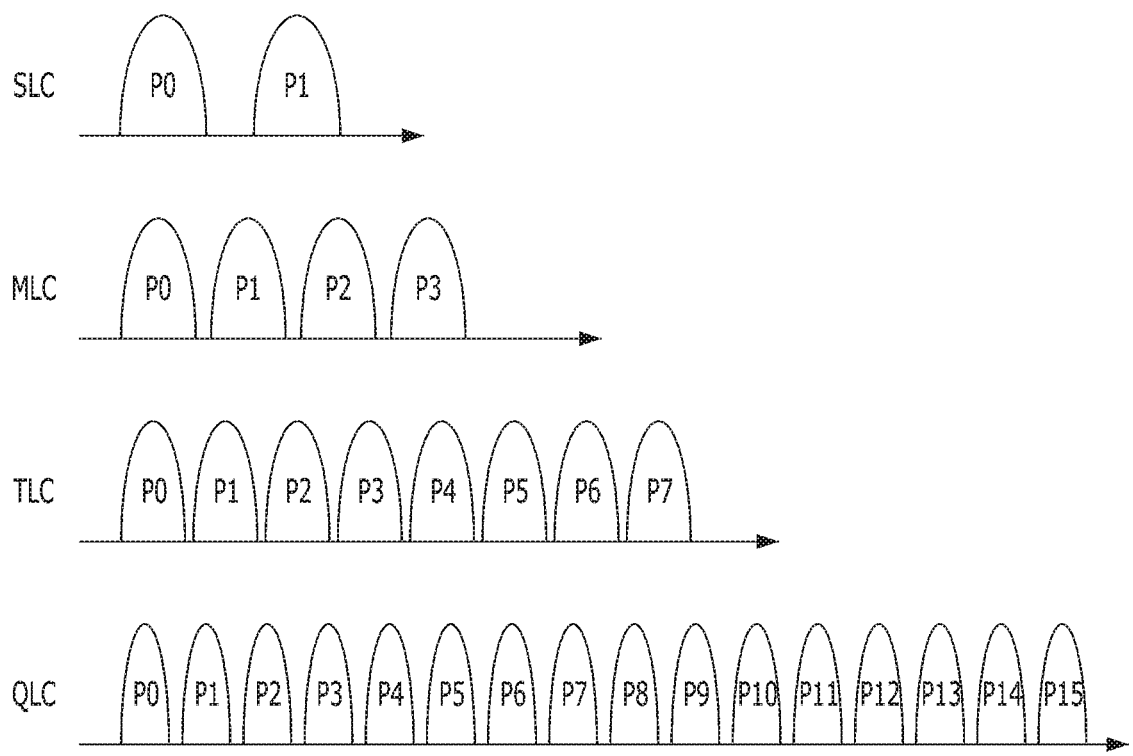
FIG. 4 is a diagram illustrating distributions of states for different types of cells of a memory device.

FIG. 4 is a diagram illustrating distributions of states or program voltage (PV) levels for different types of cells of a memory device.

As described above, each of memory cells may be implemented with a specific type of cell, for example, a single level cell (SLC) storing 1 bit of data, a multi-level cell (MLC) storing 2 bits of data, a triple-level cell (TLC) storing 3 bits of data, or a quadruple-level cell (QLC) storing 4 bits of data. Usually, all memory cells in a particular memory device are of the same type, but that is not a requirement. FIG. 4 shows the states for each of those types of cells.

An SLC may include two states P0 and P1. P0 may indicate an erase state, and P1 may indicate a program state. Since the SLC can be set in one of two different states, each SLC may program or store 1 bit according to a set coding method. An MLC may include four states P0, P1, P2 and P3. Among these states, P0 may indicate an erase state, and P1 to P3 may indicate program states. Since the MLC can be set in one of four different states, each MLC may program or store two bits according to a set coding method. A TLC may include eight states P0 to P7. Among these states, P0 may indicate an erase state, and P1 to P7 may indicate program states. Since the TLC can be set in one of eight different states, each TLC may program or store three bits according to a set coding method. A QLC may include 16 states P0 to P15. Among these states, P0 may indicate an erase state, and P1 to P15 may indicate program states. Since the QLC can be set in one of sixteen different states, each QLC may program or store four bits according to a set coding method.

Figure 5:
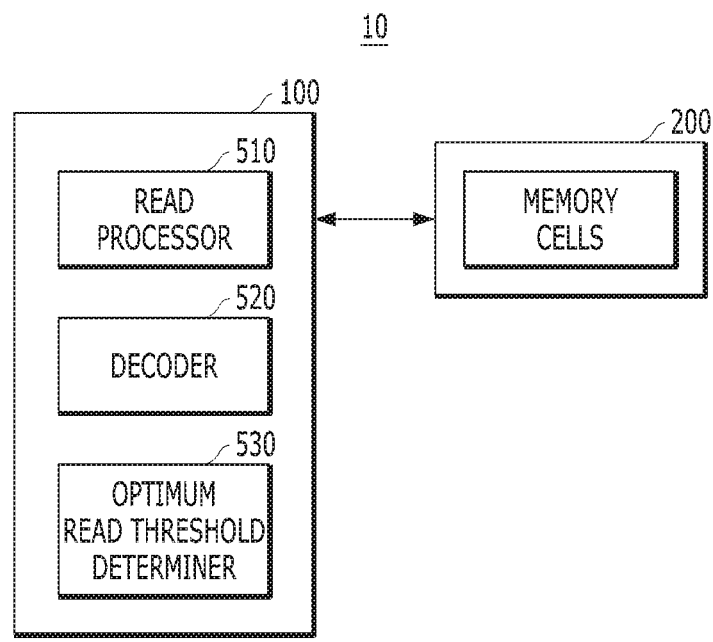
FIG. 5 is a diagram illustrating a memory system in accordance with an embodiment of the present invention.

FIG. 5 is a diagram illustrating a memory system 10 in accordance with an embodiment of the present invention.

Referring to FIG. 5, the memory system 10 may include a controller 100 and a memory device 200. The memory device 200 may include a plurality of memory cells (e.g., NAND flash memory cells). The memory cells are arranged in an array of rows and columns as shown in FIG. 3. The cells in each row are connected to a word line (e.g., WL0), while the cells in each column are coupled to a bit line (e.g., BL0). These word and bit lines are used for read and write operations. During a write operation, the data to be written ('1' or '0') is provided at the bit line while the word line is asserted. During a read operation, the word line is again asserted, and the threshold voltage of each cell can then be acquired from the bit line. Multiple pages may share the memory cells that belong to (i.e., are coupled to) the same word line. When the memory cells are implemented with MLCs, the multiple pages include a most significant bit (MSB) page and a least significant bit (LSB) page. When the memory cells are implemented with TLCs, the multiple pages include an MSB page, a center significant bit (CSB) page and an LSB page. When the memory cells are implemented with QLCs, the multiple pages include an MSB page, a center most significant bit (CMSB) page, a center least significant bit (CLSB) page and an LSB page. The memory cells may be programmed using a coding scheme (e.g., Gray coding) in order to increase the capacity of the memory system 10 such as an SSD.

Figure 6:
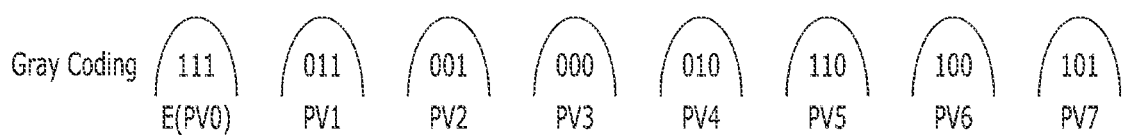
FIG. 6 is a diagram illustrating an example of Gray coding for a triple level cell (TLC).

FIG. 6 is a diagram illustrating an example of Gray coding for a triple level cell (TLC). Referring to FIG. 6, a TLC may be programmed using Gray coding. As described above, a TLC may have 8 program states, which include an erased state E (or PV0) and first to seventh program states PV1 to PV7. The erased state E (or PV0) may correspond to "111." The first program state PV1 may correspond to "011." The second program state PV2 may correspond to "001." The third program state PV3 may correspond to "000." The fourth program state PV4 may correspond to "010." The fifth program state PV5 may correspond to "110." The sixth program state PV6 may correspond to "100." The seventh program state PV7 may correspond to "101."

Figure 7:
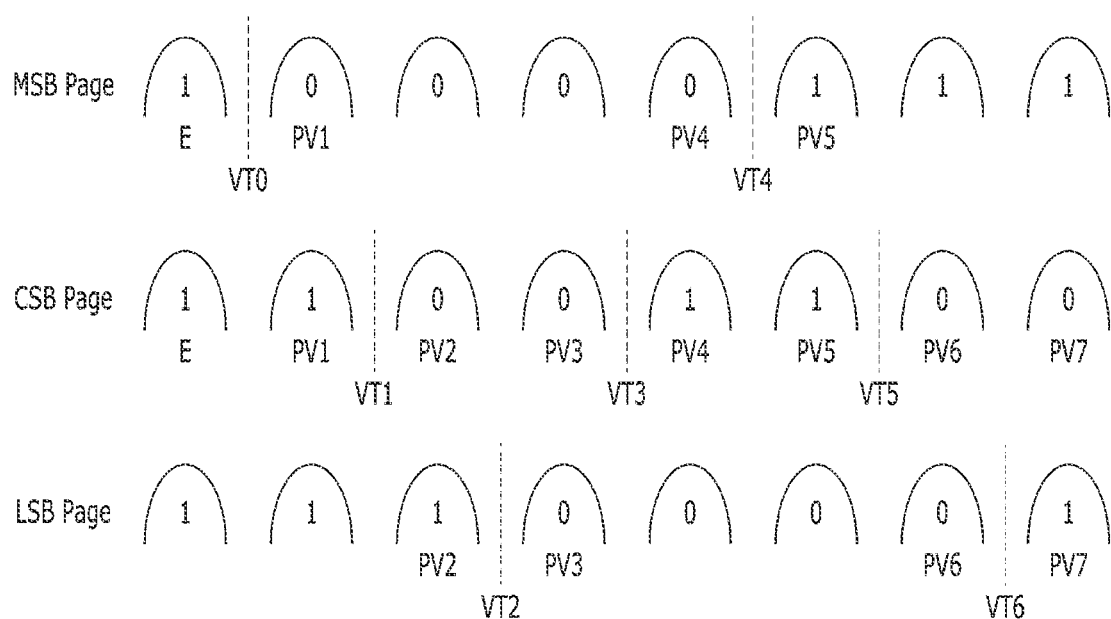
FIG. 7 is a diagram illustrating state distributions for pages of a triple level cell (TLC).

In a TLC, as shown in FIG. 7, there are 3 types of pages including LSB, CSB and MSB pages. 2 or 3 thresholds may be applied in order to retrieve data from the TLC. For an MSB page, 2 thresholds include a first threshold value VT0 and a second threshold value VT4. The first threshold value VT0 distinguishes between an erase state E and a first program state PV1. The second threshold value VT4 distinguishes between a fourth program state PV4 and a fifth program state PV5. For a CSB page, 3 thresholds include a first threshold value VT1, a second threshold value VT3 and a third threshold value VT5. The first threshold value VT1 distinguishes between a first program state PV1 and a second program state PV2. The second threshold value VT3 distinguishes between a third program state PV3 and the fourth program state PV4. The third threshold value VT5 distinguishes between the fourth program state PV5 and the sixth program state PV6. For an LSB page, 2 thresholds include a first threshold value VT2 and a second threshold value VT6. The first threshold value VT2 distinguishes between the second program state PV2 and the third program state PV3. The second threshold value VT6 distinguishes between the sixth program state PV6 and a seventh program state PV7.

Referring back to FIG. 5, the controller 100 may include a read processor 510, a decoder 520 and an optimum read threshold determiner 530. These components may be implemented with internal components of the control component 120 (i.e., firmware (FW)) in FIG. 2. Although not shown in FIG. 5, the controller 100 and the memory device 200 may include various other components as shown in FIG. 2.

The read processor 510 may control read operations for the memory device 200 in response to a read request from a host (e.g., the host 5 of FIG. 1). The read processor 510 may control the read operations based on various read threshold values. The decoder 520 may decode data associated with the read operations. In some embodiments, the read processor 510 may control the read operations as shown in FIG. 8.

Figure 8:
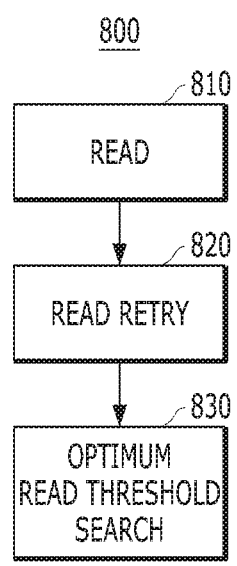
FIG. 8 is a flowchart illustrating a read operation of a memory device.

Referring to FIG. 8, which depicts read operation 800, at step 810, the read processor 510 may control a read operation for the memory cells using a select read threshold set. In some embodiments, the select read threshold set may be the read threshold set used in the last successful decoding. When the read operation is performed for the MSB page of TLC, the select read threshold set may include a pair of first and second read thresholds [VT0, VT4] as shown in FIG. 7. The first read threshold value VT0 is used to distinguish between an erase state (i.e., E) and a first program state (i.e., PV1), and the second read threshold value VT4 is used to distinguish between a fourth program state (i.e., PV4) and a fifth program state (i.e., PV5). When the read operation is performed for the LSB page of TLC, the select read threshold set may include a pair of first and second read thresholds [VT2, VT6] as shown in FIG. 7. The first read threshold value VT2 is used to distinguish between a second program state (i.e., PV2) and a third program state (i.e., PV3), and the second read threshold value VT6 is used to distinguish between a sixth program state (i.e., PV6) and a seventh program state (i.e., PV7).

It may be determined whether the read operation using the select read threshold set succeeded or failed, depending on the decoding result of the decoder 520. When the read operation using the select read threshold set failed, the read processor 510 may control one or more read retry operations for the memory cells using a read retry threshold set at step 820. In some embodiments, the read retry involves performing 5 different read attempts with different but static read threshold settings.

It may be determined whether all read retry operations using the read retry threshold set succeeded or failed, depending on the decoding result of the decoder 520. When all read retry operations using the read retry thresholds failed, the read processor 510 may control the optimum read threshold determiner 530 to perform an optimum read threshold search at step 830 and then perform soft decoding. Typically, the optimum read threshold search may be known as eBoost. The soft decoding requires many read retry operations in the eBoost stage to find the optimum center read threshold. The number of read retry operations may be up to 20, and sometimes even more. Read latency of each read for TLC memory device may be around 50 us, and read latency of each read for QLC memory device may be around 125 us. The number of read retry operations significantly increases the read latency and decreases the quality of service (QoS) of the associated memory device. Accordingly, various embodiments provide a read threshold optimization scheme capable of reducing read latency and improving QoS. The read threshold optimization scheme may replace eBoost and hence significantly reduces latency.

As described above, when an initial read operation and all read retry operations using the read retry thresholds failed, the controller 100 of FIG. 5 should search for an optimum read threshold. In other words, an initial read threshold should be changed to the optimum read threshold as shown in FIG. 9.

Figure 9:
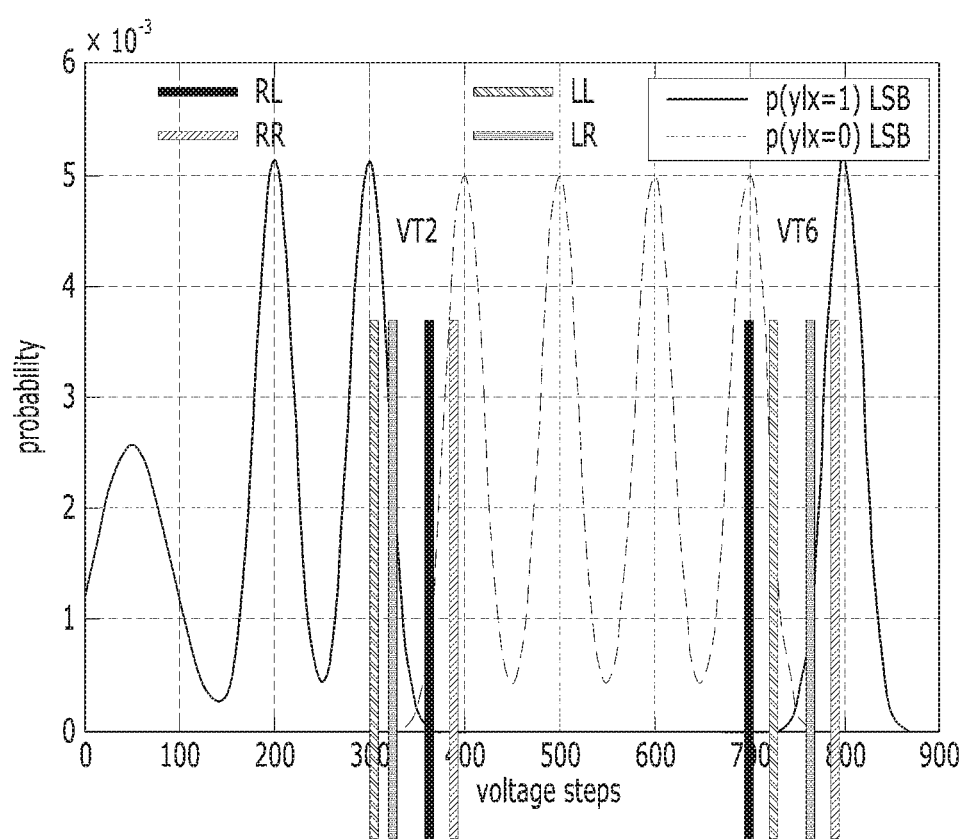
FIG. 9 is a diagram illustrating changes of a read threshold set for an LSB page of a triple level cell (TLC) memory device.

FIG. 9 is a diagram illustrating changes of a read threshold set for an LSB page of a triple level cell (TLC) memory device. Note that the LSB page is programmed by Gray code shown in FIGS. 6 and 7.

In FIG. 9, to read the LSB page, the controller 100 should read the TLC at an initial read threshold set [VT2, VT6] including a first read threshold VT2 and a second read threshold VT6. The initial read threshold set [VT2, VT6] may be a set of ideal read thresholds with respect to a voltage distribution as shown in FIG. 9.

There are 4 possible cases RL, RR, LR and LL, depending on the relative positions between the read threshold set [VT2, VT6] and the optimum read threshold set [VT2*, VT6*]. RL represents that VT2 is on the left of VT2* and VT6 is on the right of VT6*, i.e., VT2* is on the right of VT2 and VT6* is on the left of VT6. RR represents that VT2* is on the right of VT2 and VT6* is on the right of VT6. LR represents that VT2* is on the left of VT2 and VT6* is on the right of VT6. LL represents that VT2* is on the left of VT2 and VT6* is on the left of VT6.

Referring back to FIG. 5, the optimum read threshold determiner 530 may perform an optimum read threshold search using asymmetric ratio (AR) values associated with decoding of multiple read attempts (i.e., read retry operations). In other words, the optimum read threshold determiner 530 may perform AR-domain translation to search for an optimum read threshold. In some embodiments, the optimum read threshold determiner 530 may perform a read threshold optimization operation as shown in FIG. 10.

Figure 10:
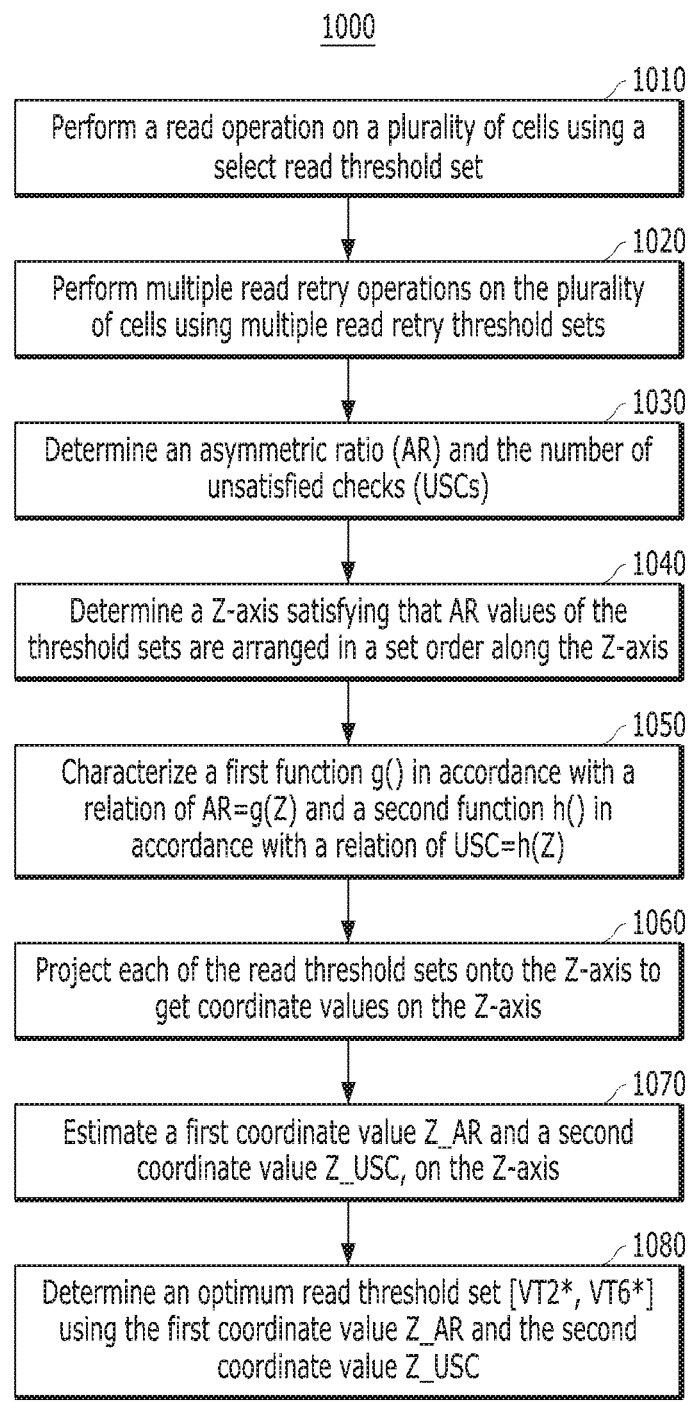
FIG. 10 is a flowchart illustrating a read threshold optimization operation in accordance with an embodiment of the present invention.

FIG. 10 is a flowchart illustrating a read threshold optimization operation 1000 in accordance with an embodiment of the present invention. The read threshold optimization operation 1000 may be performed by firmware (e.g., components 510, 520 and 530 of the controller 100 in FIG. 5). By way example and without any limitation, FIG. 10 illustrates the read threshold optimization operation 1000 for an LSB page of TLC. However, the read threshold optimization operation 1000 may be applied to other pages (i.e., MSB and CSB pages) of TLC, other pages (i.e., MSB, LSB, CMSB and CLSB pages) of QLC, or to pages of other types of NANDs consistent with the teachings herein.

Referring to FIG. 10, at step 1010, the read processor 510 may perform a read operation on a plurality of cells using a select read threshold set, which may be a previously-used, i.e., history, read threshold set. The select threshold set may include first and second read thresholds, which were used in the last successful decoding. For example, the select read threshold set may include a pair [VT2, VT6] of read thresholds, i.e., a first read threshold VT2 and a second read threshold VT6. Further, the controller 100 may decode data associated with the read operation.

When the decoding result of the decoder 520 indicates that the read operation using the select read threshold set failed, step 1020 may be performed. At step 1020, the read processor 510 may perform multiple read retry operations on the plurality of cells using multiple read retry threshold sets. In some embodiments, each of the multiple read retry threshold sets may be different from the select read threshold set. For example, a read retry threshold set may include a first read retry threshold and a second read retry threshold, each of which is different than (i.e., increased or decreased relative to) its counterpart of the select read threshold set. Further, the controller 100 may decode data associated with each of the read retry operations.

When the decoding result of the decoder 520 indicates that all read retry operations using the read retry threshold sets failed, step 1030 may be performed in which data from each of the read retry threshold operations is analyzed. At step 1030, for each decoded data, the optimum read threshold determiner 530 may determine an asymmetric ratio (AR) and the number of unsatisfied checks (USCs). In some embodiments, the AR may indicate a ratio of the number of a first binary value (i.e., 1's) to the number of a second binary value (i.e., 0's) in the decoded data. For example, the AR may be a value representing the number of 1's divided by the number of 0's in the decoded raw data. In an embodiment in which reverse logic convention is used, AR may be the number of 0's divided by the number of 1's.

At step 1040, the optimum read threshold determiner 530 may determine a Z-axis such that AR values of the threshold sets are arranged in a set order along the Z-axis. In some embodiments, the Z-axis is determined such that the AR values of the threshold sets are arranged in ascending order along the Z-axis, as shown in FIG. 11.

Figure 11:
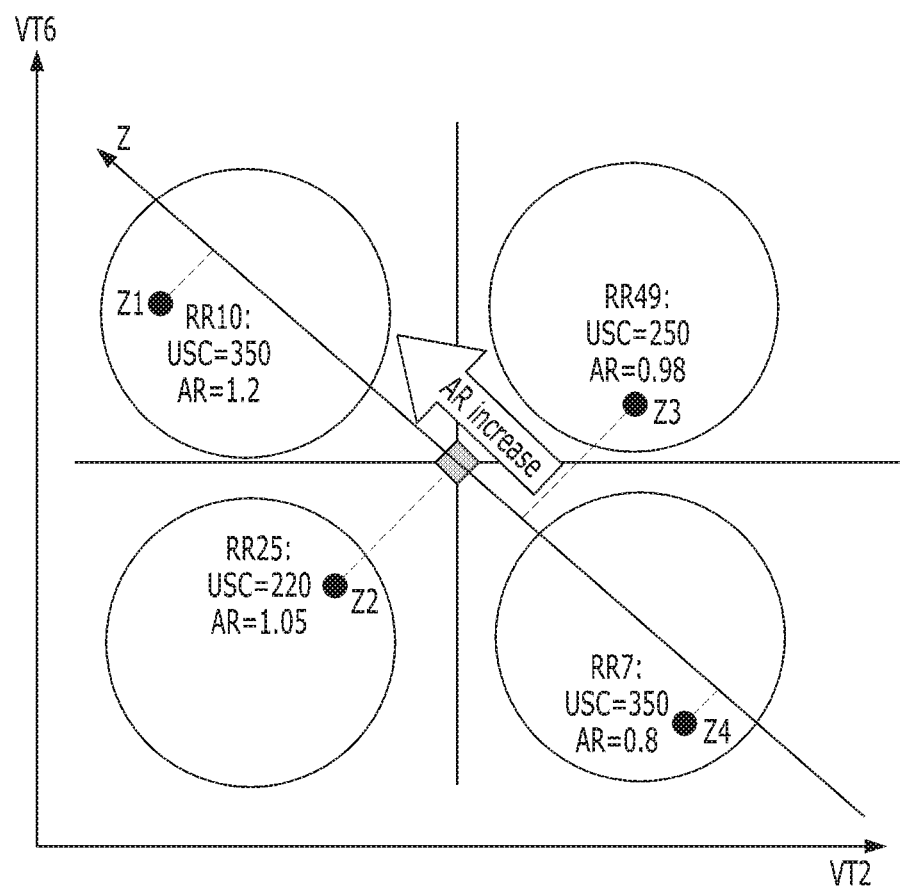
FIG. 11 illustrates a Z-axis satisfying that AR values of threshold sets are arranged in ascending order along the Z-axis, in accordance with an embodiment of the present invention.

In FIG. 11, each symbol "•" represents a particular threshold set for a corresponding read attempt, e.g., [VT2, VT6] and the symbol "◇" in the center represents an optimum threshold set [VT2*, VT6*]. For the threshold set [VT2, VT6] corresponding to the read retry RR7, AR is 0.8 and the number of USCs is 350. For the threshold set [VT2, VT6] corresponding to the read retry RR49, AR is 0.98 and the number of USCs is 250. For the threshold set [VT2, VT6] corresponding to the read retry RR25, AR is 1.05 and the number of USCs is 220. For the threshold set [VT2, VT6] corresponding to the read retry RR10, AR is 1.2 and the number of USCs is 350. In this illustrated example, the controller 100 may determine the Z-axis such that AR values of the threshold sets are arranged in ascending order along the Z-axis (i.e., in increasing order AR=0.8→AR=0.98→AR=1.05→AR=1.2). In some embodiments, the Z-axis corresponds to a line passing through an average of the sets of the first and second read thresholds [VT2, VT6] with slope of −1. By having a slope of −1, the Z-axis extends diagonally along two ranges of read threshold values such that AR values of the threshold sets are arranged in a set order along the Z-axis, as shown in FIG. 11.

Figure 12:
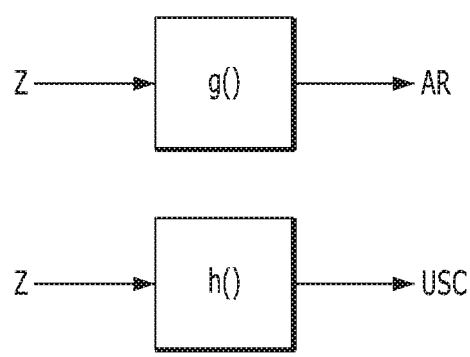
FIG. 12 illustrates characterizing a first function g( ) in accordance with a relation of AR=g(Z) and a second function h( ) in accordance with a relation of USC=h(Z), in accordance with an embodiment of the present invention.

At step 1050, the optimum read threshold determiner 530 may characterize a first function g( ) in accordance with a relation of AR=g(Z) and a second function h( ) in accordance with a relation of USC=h(Z), as shown in FIG. 12. The first function g( ) models how AR values change along the Z-axis. The second function h( ) models how USC values change along the Z-axis.

At step 1060, the optimum read threshold determiner 530 may project each of the read threshold sets onto the Z-axis to get coordinate values on the Z-axis. For example, [VT2, VT6] coordinates of all 4 previous read attempts (e.g., RR7, RR10, RR25, RR49 in FIG. 11) are projected onto the Z-axis to get corresponding coordinate values Z1, Z2, Z3 and Z4.

Figure 13A:
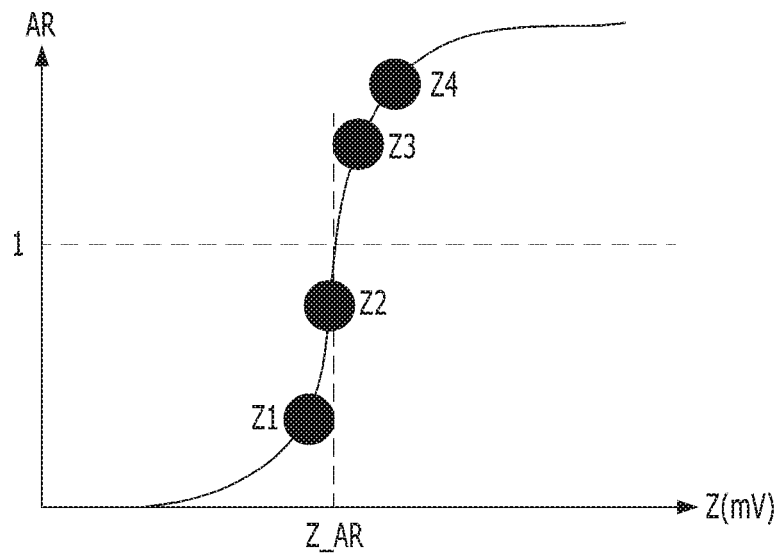
FIGS. 13A and 13B illustrate estimating a first coordinate value Z_AR and a second coordinate value Z_USC, in accordance with an embodiment of the present invention.

At step 1070, the optimum read threshold determiner 530 may estimate a first coordinate value on the Z-axis which corresponds to a set AR value using the first function g( ) and the coordinate values Z1 to Z4. In some embodiments, as shown in FIG. 13A, the optimum read threshold determiner 530 may estimate the first coordinate value Z_AR on the Z-axis which corresponds to the set AR value '1' using the first function g( ) and the coordinate values Z1 to Z4.

Figure 13B:
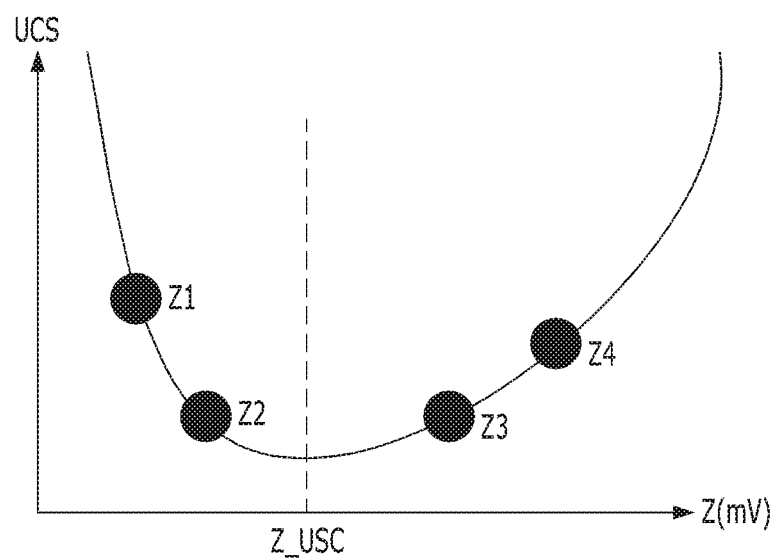

Further, the optimum read threshold determiner 530 may estimate a second coordinate value on the Z-axis which corresponds to the lowest USC value, which is located along a curve fitting Z1, Z2, Z3 and Z4. In some embodiments, as shown in FIG. 13B, the optimum read threshold determiner 530 may estimate the second coordinate value Z_USC on the Z-axis which corresponds to the lowest USC value. For this operation, various kind of curve fitting or gradient decent algorithms may be used.

Figure 14:
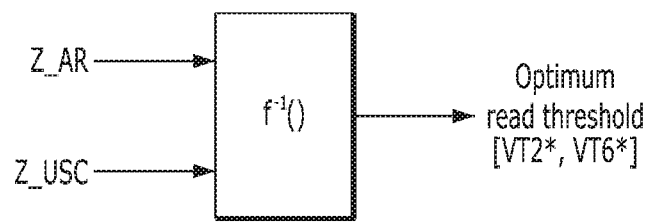
FIG. 14 illustrates determining an optimum read threshold set [VT2*, VT6*] using the first coordinate value Z_AR and the second coordinate value Z_USC, in accordance with an embodiment of the present invention.

At step 1080, the optimum read threshold determiner 530 may determine an optimum read threshold set [VT2*, VT6*] using the first coordinate value Z_AR and the second coordinate value Z_USC, as shown in FIG. 14. In some embodiments, the optimum read threshold determiner 530 may estimate the optimum read threshold set [VT2*, VT6*] using an average of the first coordinate value Z_AR and the second coordinate value Z_USC as the following equation: [VT2, VT6]=$f^{-1}$((Z_AR+Z_USC)/2).

As described above, embodiments provide a scheme for estimating optimum read threshold values using USC and AR values associated with all previous read attempts, which are obtained through AR-domain transformation. This scheme requires a relatively low number of reads before soft decoding, and no extra read(s) is/are needed to search for the optimum central read threshold for soft decoding.

Although the foregoing embodiments have been illustrated and described in some detail for purposes of clarity and understanding, the present invention is not limited to the details provided. There are many alternative ways of implementing the invention, as one skilled in the art will appreciate in light of the foregoing disclosure. The disclosed embodiments are thus illustrative, not restrictive. The present invention is intended to embrace all modifications and alternatives that fall within the scope of the claims

What is claimed is:

1. A memory system comprising:
   a memory device including a plurality of cells; and
   a controller, coupled to the memory device, configured to:
   receive, by a read processor in the controller, a read request from a host device;
   perform, by the read processor, in response to the read request, multiple read operations on the plurality of cells using multiple read threshold voltages of a read threshold set and at least one read retry threshold set, each of the threshold sets including first and second read thresholds, the multiple read operations acquiring voltages from the plurality of cells of the memory device in order to read data from the plurality of cells of the memory device;
   decode the data associated with each of the read operations utilizing a decoder in the controller that determines if the multiple read operations using the multiple read threshold voltages of the read threshold set have failed;
   determine, by an optimum read threshold determiner in the controller, for the decoded data determined in the controller of each of the read operations, an asymmetric ratio (AR) and a number of unsatisfied checks (USCs), the AR indicating a ratio of a number of a first binary value to a number of a second binary value in the decoded data;
   determine, by the optimum read threshold determiner, from the decoded data determined in the controller, a Z-axis extending diagonally along two ranges of read threshold values such that AR values of the threshold sets are arranged in a set order along the Z-axis;
   determine, by the optimum read threshold determiner, from the decoded data determined in the controller, an optimum read threshold set using coordinate values on the Z-axis, which correspond to a set AR value and a set USC value;
   read, by the read processor, the data from the plurality of cells using the optimum read threshold set; and transmit, by the read processor, the read data to the host device, wherein the controller, in response to determining the optimum read threshold set, determines the coordinate values on the Z-axis using only the previously decoded data determined in the controller associated with previous read attempts without needing extra reads to search for an optimum read threshold for soft decoding, and the controller without needing the extra reads to search for the optimum read threshold thereby reduces a read latency and improves a quality of service of the memory device.

2. The memory system of claim 1, wherein the controller:

characterizes a first function go in accordance with a relation of AR=g(Z) and a second function h( ) in accordance with a relation of USC=h(z);

projects each of the threshold sets onto the Z-axis to get the coordinate values on the Z-axis; and estimates a first coordinate value on the Z-axis which corresponds to the set AR value using the first function go and the coordinate values and a second coordinate value on the Z-axis which corresponds to a lowest USC value, and wherein the optimum read threshold set is determined using the first and second coordinate values.

3. The memory system of claim 2, wherein the plurality of cells are coupled to a word line and include multiple pages.

4. The memory system of claim 3, wherein the multiple pages include a most significant bit (MSB) page, a center significant bit (CSB) page and a least significant bit (LSB) page.

5. The memory system of claim 4, wherein the plurality of cells are programmed using Gray coding.

6. The memory system of claim 2, wherein the multiple read operations include a read operation and one or more read retry operations, and wherein the controller performs the read operation using the read threshold set corresponding to a history read threshold set, and performs the read retry operations using two or more read retry threshold sets in response to the read operation having failed.

7. The memory system of claim 2, wherein the Z-axis is determined such that the AR values, obtained by projection onto the Z-axis, of the threshold sets are arranged in an ascending order along the diagonally extending Z-axis.

8. The memory system of claim 2, wherein the Z-axis corresponds to a line passing through an average of the first and second read thresholds with a slope of −1.

9. The memory system of claim 2, wherein the set AR value includes an AR value of 1.

10. The memory system of claim 2, wherein the controller estimates the optimum read threshold set using an average of the first coordinate value and the second coordinate value.

11. A method for operating a memory system, which includes a memory device including a plurality of cells and a controller coupled to the memory device, the method comprising:

receiving under direction of a read processor of the controller a read request from a host device;

performing, in response to the read request, under direction of the read processor of the controller multiple read operations on the plurality of cells using multiple read threshold voltages of a read threshold set and at least one read retry threshold set, each of the threshold sets including first and second read thresholds, the multiple read operations acquiring voltages from the plurality of cells of the memory device in order to read data from the plurality of cells of the memory device;

decoding under direction of the controller the data associated with each of the read operations utilizing a decoder in the controller that determines if the multiple read operations using the multiple read threshold voltages of the read threshold set have failed;

determining under direction of an optimum read threshold determiner of the controller, for the decoded data determined in the controller of each of the read operations, an asymmetric ratio (AR) and a number of unsatisfied checks (USCs), the AR indicating a ratio of a number of a first binary value to a number of a second binary value in the decoded data;

determining under direction of the optimum read threshold determiner of the controller, from the decoded data determined in the controller, a Z-axis extending diagonally along two ranges of read threshold values such that AR values of the threshold sets are arranged in a set order along the Z-axis;

determining under direction of the optimum read threshold determiner of the controller, from the decoded data determined in the controller, an optimum read threshold set using coordinate values on the Z-axis, which correspond to a set AR value and a set USC value;

reading under direction of the read processor the data from the plurality of cells using the optimum read threshold set; and transmitting under direction of the read processor the read data to the host device, wherein the controller, in response to determining the optimum read threshold set, determines the coordinate values on the Z-axis using only the previously decoded data determined in the controller associated with previous read attempts without needing extra reads to search for an optimum read threshold for soft decoding, and the controller without needing the extra reads to search for the optimum read threshold thereby reduces a read latency and improves a quality of service of the memory device.

12. The method of claim 11, further comprising:

characterizing a first function go in accordance with a relation of AR=g(Z) and a second function h( ) in accordance with a relation of USC=h(z);

projecting each of the threshold sets onto the Z-axis to get the coordinate values on the Z-axis;

estimating a first coordinate value on the Z-axis which corresponds to the set AR value using the first function go and the coordinate values and a second coordinate value on the Z-axis which corresponds to a lowest USC value, wherein the optimum read threshold set is determined using the first and second coordinate values.

13. The method of claim 12, wherein the plurality of cells are coupled to a word line and include multiple pages.

14. The method of claim 13, wherein the multiple pages include a most significant bit (MSB) page, a center significant bit (CSB) page and a least significant bit (LSB) page.

15. The method of claim 14, wherein the plurality of cells are programmed using Gray coding.

16. The method of claim 12, wherein the multiple read operations include a read operation and one or more read retry operations, and wherein the performing of the multiple read operations comprises:

performing the read operation using the read threshold set corresponding to a history read threshold set; and performing the read retry operations using two or more read retry threshold sets in response to the read operation having failed.

17. The method of claim 12, wherein the Z-axis is determined such that the AR values, obtained by projection onto the Z-axis, of the threshold sets are arranged in an ascending order along the diagonally extending Z-axis.

18. The method of claim 12, wherein the Z-axis corresponds to a line passing through an average of the first and second read thresholds with a slope of −1.

19. The method of claim 12, wherein the set AR value includes an AR value of 1.

20. The method of claim 12, wherein the determining of the optimum read threshold set comprises:

estimating the optimum read threshold set using an average of the first coordinate value and the second coordinate value.

* * * * *